(12) United States Patent
Zhou et al.

(10) Patent No.: US 10,984,778 B2
(45) Date of Patent: Apr. 20, 2021

(54) FREQUENCY DOMAIN ADAPTATION WITH DYNAMIC STEP SIZE ADJUSTMENT BASED ON ANALYSIS OF STATISTIC OF ADAPTIVE FILTER COEFFICIENT MOVEMENT

(71) Applicant: Cirrus Logic International Semiconductor Ltd., Edinburgh (GB)

(72) Inventors: Dayong Zhou, Austin, TX (US); Chin Huang Yong, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/516,644

(22) Filed: Jul. 19, 2019

(65) Prior Publication Data
US 2021/0020157 A1   Jan. 21, 2021

(51) Int. Cl.
 *G10K 11/178* (2006.01)
(52) U.S. Cl.
 CPC .. *G10K 11/17854* (2018.01); *G10K 11/17881* (2018.01); *G10K 2210/1081* (2013.01); *G10K 2210/3028* (2013.01); *G10K 2210/3044* (2013.01)
(58) Field of Classification Search
 USPC ..... 381/71.11, 71.12, 94.3, 98, 99, 316, 402
 See application file for complete search history.

(56) References Cited

U.S. PATENT DOCUMENTS

| | | | |
|---|---|---|---|
| 9,036,816 | B1 | 5/2015 | Ayrapetian et al. |
| 9,324,311 | B1 | 4/2016 | Abdollahzadeh Milani et al. |
| 9,502,020 | B1 | 11/2016 | Abdollahzadeh Milani et al. |
| 9,633,646 | B2 | 4/2017 | Hendrix et al. |
| 2009/0060167 | A1* | 3/2009 | Deng ............... H04B 3/23 379/406.08 |
| 2012/0195439 | A1 | 8/2012 | Ohta et al. |
| 2013/0315408 | A1 | 11/2013 | Yano et al. |
| 2017/0142532 | A1 | 5/2017 | Pan |

(Continued)

OTHER PUBLICATIONS

Zhou, Dayong et al. "A New Rapid Frequency-Domain Adaptation of Casual Fir Filters." IEEE DSP Workshop. Sep. 2006. pp. 332-335.

(Continued)

*Primary Examiner* — Yosef K Laekemariam
(74) *Attorney, Agent, or Firm* — E. Alan Davis; James W. Huffman

(57) ABSTRACT

An adaptive filter includes a frequency domain adaptation block that analyzes a statistic of coefficient movement in the frequency domain. The adaption block adjusts, in the frequency domain, a parameter (step size or leakage factor) that affects speed of convergence of the adaptive filter based on the analyzed statistic of filter coefficient movement. The filter includes an associated coefficient, statistic of coefficient movement, and parameter for each frequency bin. The coefficients may be complex numbers, and separate real and imaginary statistics and parameters are maintained. The statistic may be direction counts of the filter coefficient movement. The step size may be adjusted to a predetermined minimum value when the current direction of movement of the filter coefficient is different than the predominant direction and otherwise the step size is adjusted approximately proportionally to an amount of predominance by a value based on a direction count of the filter coefficient movement.

28 Claims, 10 Drawing Sheets

(56) References Cited

U.S. PATENT DOCUMENTS

| | | | |
|---|---|---|---|
| 2017/0178617 A1 | 6/2017 | Christoph et al. | |
| 2017/0229111 A1 | 8/2017 | Hanazono et al. | |
| 2017/0276398 A1* | 9/2017 | Hanazono | F24C 15/2042 |
| 2018/0308465 A1 | 10/2018 | Zhou et al. | |
| 2020/0043461 A1* | 2/2020 | Zollner | G10K 11/17854 |
| 2021/0020158 A1 | 1/2021 | Zhou | |

OTHER PUBLICATIONS

Wu, Ming et al. "An Improved Active Noise Control Algorithm Without Secondary Path Identification Based on the Frequency-Domain Subband Architecture." IEEE Transactions on Audio, Speech, and Language Processing. vol. 16, No. 8, Nov. 2008. pp. 1409-1419.

Morgan, Dennis R. et al. "A Delayless Subband Adaptive Filter Architecture." IEEE Transactions on Signal Processing, vol. 43, No. 8, Aug. 1995. pp. 1819-1820.

Park, Seon Joon et al. "A Delayless Subband Active Noise Control System for Wideband Noise Control." IEEE Transactions on Speech and Audio Processing. vol. 9, No. 8, Nov. 2001. pp. 892-899.

Yang, Feiran et al. "Frequency-Domain Filtered-x LMS Algorithms for Active Noise Control: A Review and New Insights." Applied Science vol. 8, Nov. 20, 2018. pp. 1-20.

Faza, Ayman et al. "Adaptive Regularization in Frequency-Domain NLMS Filters." 20th European Signal Processing Conference (EUSIPCO 2012) Bucharest, Romania, Aug. 27-31, 2021. pp. 2625-2628.

Chen, Rui et al. "Adaptive Filter by Using Proportionate Frequency Domain Extended Correlation LMS Algorithm in the Double-Talk Condition." Signal Processing, 2008. ICSP 2008. 9th International Conference on IEEE. Piscataway, NJ. Oct. 26, 2008. pp. 1826-1829.

Benesty, Jacob et al. "An Improved PNLMS Algorithm." 2002 IEEE International Conference on Acoustics, Speech, and Signal Processing Proceedings (ICASSP) Orlando, FL. May 13-17, 2002. pp. II-1181-II-1184.

Szadkowski, Zbigniew et al. "The Least Mean Squares Adaptive FIR Filter for Narrow-Band RFI Suppression in Radio Detection of Cosmic Rays." *IEEE Transactions on Nuclear Science*, vol. 64, No. 6 Jun. 2017. pp. 1304-1315.

* cited by examiner

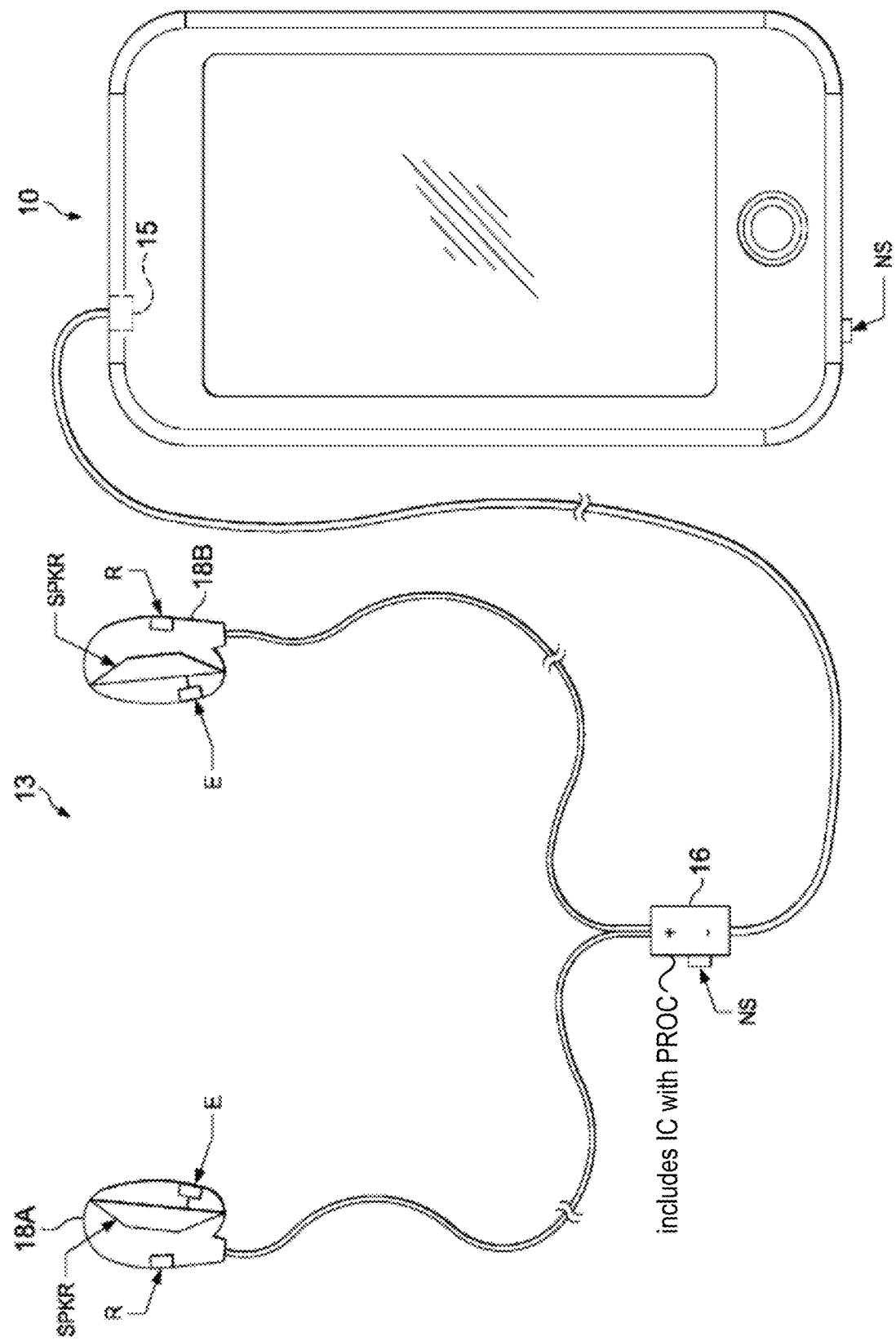

FREQUENCY DOMAIN ADAPTATION WITH DYNAMIC STEP SIZE ADJUSTMENT BASED ON ANALYSIS OF STATISTIC OF ADAPTIVE FILTER COEFFICIENT MOVEMENT

BACKGROUND

An adaptive filter iteratively models the relationship between two signals in real time. Generally, an adaptive filter receives an input signal and computes an output signal based on the input signal. The adaptive filter includes parameters that may be iteratively changed to alter the input-output relationship of the filter. The output signal is compared to a desired response signal by subtracting the output signal from the desired response signal to produce an error signal. The error signal is used to adapt the filter parameters over time according to an adaptation algorithm. The goal of the adaptation algorithm is for the output signal of the filter to eventually more closely match the desired response signal, as indicated by a decrease in the power of the error signal.

Adaptive filters may be employed in a variety of applications. For example, an adaptive filter may be employed to model the effects of a transmission channel that distorts transmitted symbols (e.g., inter-symbol interference) in order to aid in detecting the symbols at the receiver. For another example, an adaptive filter may be employed to model the transfer function of a plant so that a suitable control signal may be calculated and applied to control the plant. For another example, an adaptive filter may be employed to cancel echoes in long distance transmissions such as telephone networks, or to cancel acoustic echoes for conference-style speakerphones. For another example, an adaptive filter may be employed to perform adaptive noise canceling, such as to cancel a stronger maternal heartbeat in an electroencephalogram (EEG) in order to enable extraction of the weaker heartbeat of an unborn child. For another example, an adaptive filter may be employed to perform channel equalization, such as for use in a modem or wireless telecommunication system. For another example, an adaptive filter may be employed to perform linear predictive coding (LPC), such as for use in modeling signal correlations for a short block of data to reduce the number of bits needed to represent a signal waveform, such as a speech signal. For another example, an adaptive filter may be employed to separate a broadband signal and a nearly periodic signal, which is commonly referred to as adaptive line enhancement. For another example, an adaptive filter may be employed to perform active noise cancellation to cancel ambient noise, such as during use of a mobile phone or headset.

Generally speaking, a filter includes filter coefficients. In the case of a finite impulse response (FIR) filter, for example, the filter coefficients are multiplied by corresponding samples of the input signal and the resulting products are summed to produce the output signal. In the case of an adaptive filter, the coefficients are updated from time to time. In the case of a time domain adaptive filter, time domain samples of the error signal and the input signal are used to update the filter coefficients according to an adaptive algorithm, e.g., least-mean-square (LMS). In the case of a frequency domain adaptive filter, the adaptive filter coefficients are updated in the frequency domain rather than in the time domain. That is, filter coefficients that correspond to frequency bins are maintained. Blocks of the time domain error and input signals are transformed to the frequency domain. The adaptive algorithm uses the frequency domain component of the error and input signal associated with a frequency bin to update the filter coefficient for the frequency bin. The frequency domain coefficients can then be transformed back to the time domain and applied to the time domain input signal. Alternatively, the frequency domain coefficients can be applied to a frequency domain version of the input signal.

As the output signal of an adaptive filter more closely matches the desired response signal as indicated by a decrease in the error signal power, the adaptive filter is said to converge. Depth of convergence refers to an indication of how small the adaptive filter drives the error signal power. It is desirable for an adaptive filter, including a frequency domain adaptive filter, to converge quickly. For example, in a noise cancellation application, it is desirable for the adaptive filter to converge as quickly as possible in order to cancel the noise as quickly as possible. It is also desirable for an adaptive filter to converge deeply. Historically, speed of convergence and depth of convergence have been competing goals.

SUMMARY

Embodiments are described in which a frequency domain adaptation block of an adaptive filter counts filter coefficient movement direction for each frequency bin and detects if the filter coefficient is moving to one same direction or is doing random walks and adjusts the step size accordingly. Embodiments are also described of an active noise control (ANC) system that employs a dynamic step size adjusting frequency domain adaptive filter to improve the performance of the ANC system, e.g., in an anti-noise signal generating adaptive filter or an adaptive filter that models an electro-acoustic path of an audio device that employs the ANC system.

In one embodiment, the present disclosure provides a method that includes analyzing, in a frequency domain, a statistic of coefficient movement of an adaptive filter. The method also includes adjusting, in the frequency domain, a parameter that affects speed of convergence of the adaptive filter based on the analyzed statistic of filter coefficient movement.

In another embodiment, the present disclosure provides a digital signal processor programmed to analyze, in a frequency domain, a statistic of coefficient movement of the adaptive filter and to adjust, in the frequency domain, a parameter that affects speed of convergence of the adaptive filter based on the analyzed statistic of filter coefficient movement.

For each frequency bin of a plurality of frequency bins, the filter may include an associated coefficient, statistic of coefficient movement, and parameter that affects speed of convergence of the adaptive filter. The coefficients may be complex numbers, and the statistic of coefficient movement may include separate statistics for the real part of the coefficients and the imaginary part of the coefficients, and the parameter may include separate parameters for the real part of the coefficients and the imaginary part of the coefficients. The statistic may be direction counts of the filter coefficient movement. Adjusting the parameter based on the analyzed statistic may include adjusting the step size approximately proportionally to an amount of a predominance of a direction of movement of the filter coefficient and may also include adjusting the step size by a predetermined minimum value when the current direction is against the predominant direction of movement of the filter coefficient. Adjusting the step size approximately proportionally to an amount of a predominance of a direction of movement of the filter coefficient may include adjusting the step size by a value based on a direction count of the movement of the filter coefficient. The step size may be set to zero to freeze adaptation when a current maximum coefficient movement distance among the frequency bins substantially exceeds a smoothed version of the maximum coefficient movement distance. The parameter that affects speed of convergence may be a leakage parameter, which may be adjusted approximately inversely proportionally to an amount of a predominance of a direction of movement of the filter coefficient.

BRIEF DESCRIPTION OF THE DRAWINGS

FIG. 6B is an example wireless telephone having a headset assembly coupled to it via audio port in accordance with embodiments of the present disclosure.

DETAILED DESCRIPTION

Figure 1:
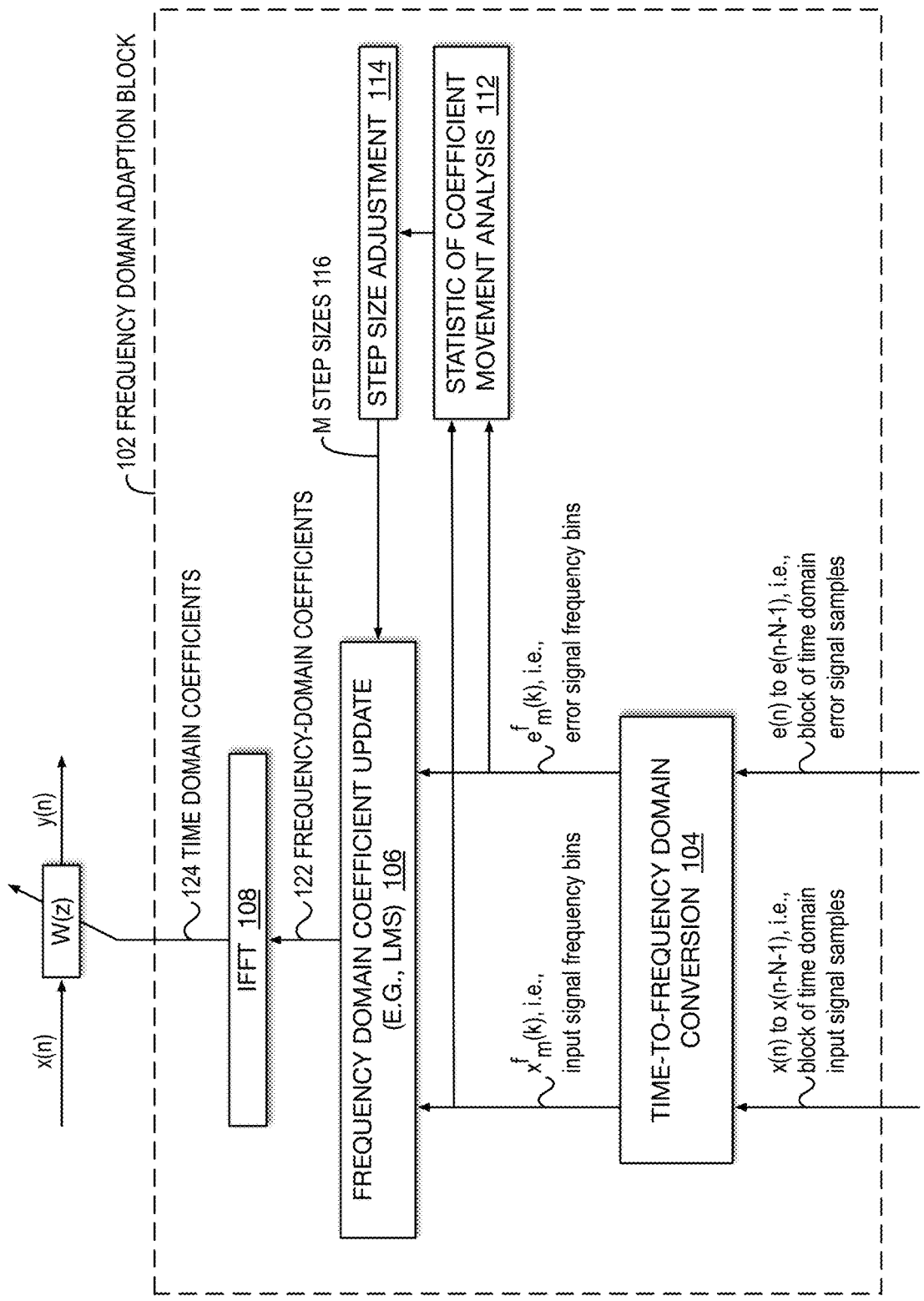
FIG. 1 is an example block diagram of an adaptive filter that includes a frequency domain coefficient adaptation block that dynamically adjusts a speed of convergence parameter based on an analysis of a statistic of coefficient movement in accordance with embodiments of the present disclosure.

FIG. 1 is an example block diagram of an adaptive filter 100 that includes a frequency domain coefficient adaptation block 102 that dynamically adjusts a speed of convergence parameter (e.g., step size, leakage) based on an analysis of a statistic of coefficient movement to improve speed and depth of convergence in accordance with embodiments of the present disclosure. The adaptive filter 100 includes a time domain filter W(z) that receives an input signal x(n) and time domain filter coefficients 124 from the frequency domain adaptation block 102. For each time frame n, the time domain filter W(z) applies the time domain filter coefficients 124 to the input signal x(n) to produce an output signal y(n).

The frequency domain adaptation block 102 includes a time-to-frequency domain conversion block 104, a frequency domain coefficient update block 106, an inverse fast Fourier transform (IFFT) block 108, a statistic of coefficient movement analysis block 112, and a step size adjustment block 114. The time-to-frequency domain conversion block 104 converts a block of N time domain input signal samples x(n) to x(n-N-1) (e.g., N=512 or 1024) into a frequency domain input signal $x_m^f(k)$, where m is a frequency bin index of M frequency bins (e.g., M=512 or 1024), and k is a sample block index. The time-to-frequency domain conversion block 104 also converts a block of N time domain error signal samples e(n) to e(n-N-1) into a frequency domain error signal $e_m^f(k)$. The frequency domain input signal $x_m^f(k)$ and the frequency domain error signal $e_m^f(k)$ are received by both the frequency domain coefficient update block 106 and the statistic of coefficient movement analysis block 112. In one embodiment, the time-to-frequency domain conversion block 104 includes blocks to perform polyphase filtering of the input and error signals.

The frequency domain coefficient update block 106 uses the frequency domain input signal $x_m^f(k)$ and frequency domain error signal $e_m^f(k)$, along with M step sizes 116 associated with the M frequency bins received from the step size adjustment block 114, to generate updated frequency domain coefficients 122. The IFFT block 108 converts the frequency domain coefficients 122 to the time domain coefficients 124 provided to the time domain filter W(z).

Equation (1) expresses a normalized LMS adaptation algorithm for computing a frequency domain filter coefficient of a next sample block k+1 for a frequency bin m $$w_m^f(k+1) = \lambda_m w_m^f(k) + \mu_m \frac{x_m^{f*}(k) e_m^f(k)}{|x_m^f(k)| |x_m^f(k)|_{max}} \tag{1}$$

where $\lambda_m$ is a leakage parameter for frequency bin m, $w_m^f(k)$ is the frequency domain filter coefficient of current sample block k for frequency bin m, $\mu_m$ is the step size for frequency bin m, $x_m^{f*}(k)$ is the complex conjugate of the frequency domain input signal of current sample block k for frequency bin m, $e_m^f(k)$ is the frequency domain error signal of current sample block k for frequency bin m, $|x_m^f(k)|$ is the magnitude of the frequency domain input signal of current sample block k for frequency bin m, and $|x_m^f(k)|_{max}$ is the magnitude of the maximum value of the frequency domain input signal for all the frequency bins of current sample block k. In one embodiment, $|x_m^f(k)|_{max}$ may be replaced with $|x_m^f(k)|$ in the denominator.

Figure 2:
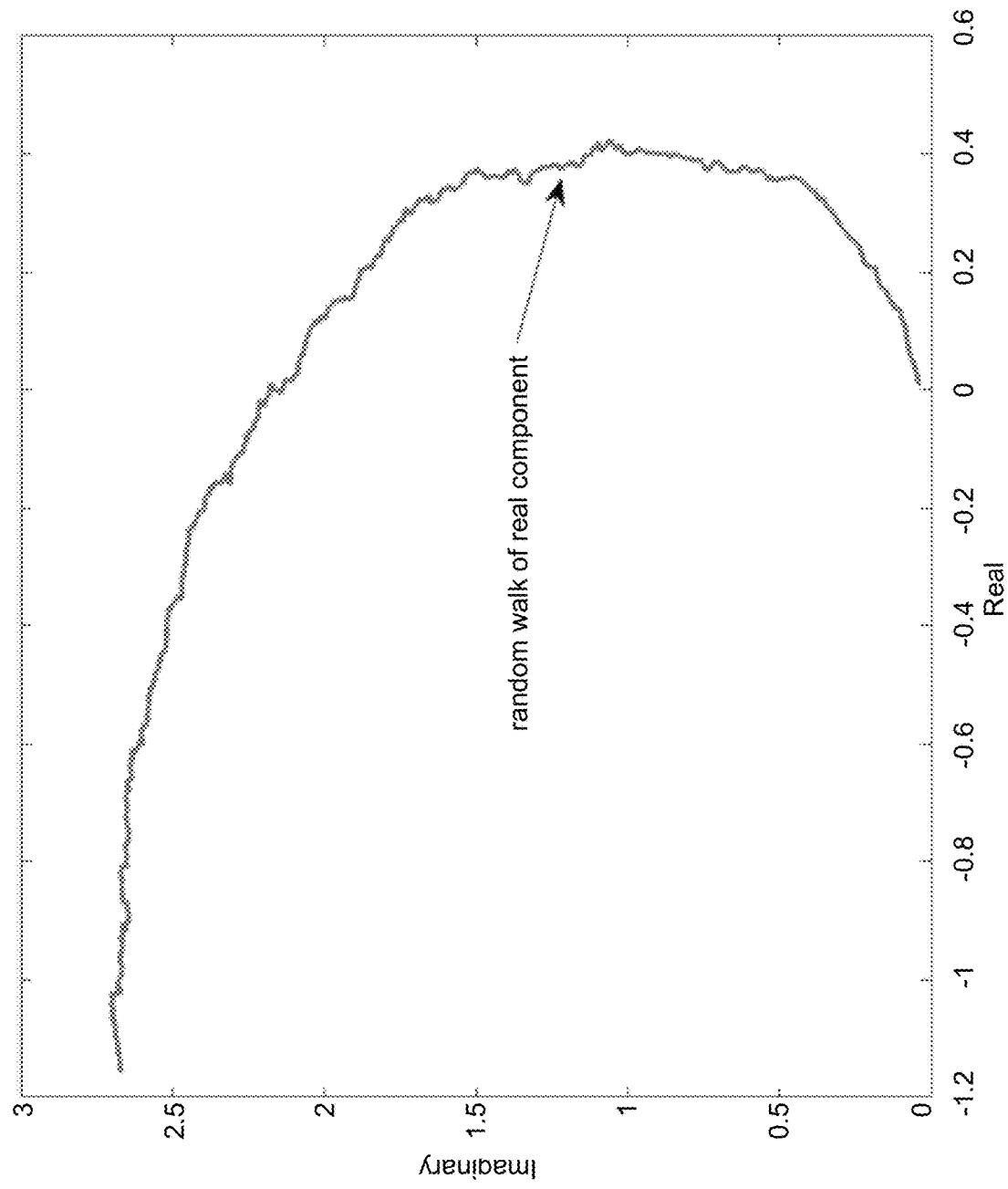
FIG. 2 is an example graph illustrating a random walk occurrence of a frequency domain adaptive filter in accordance with embodiments of the present disclosure.

As may be deduced from equation (1), the step size and leakage affect the speed at which an adaptive filter converges. It is desirable for an adaptive filter to converge as quickly as possible. Generally speaking, an adaptive filter is capable of converging faster if the step size is relatively large. However, it is also desirable for an adaptive filter to converge as deeply as possible, and generally speaking, an adaptive filter is capable of converging deeper if the step size is relatively small. In equation (1), the step size for a given frequency bin $\mu_m$ is the same for all sample blocks. However, embodiments are described in which a variable step size is employed. More specifically, the step size is made larger when an analyzed statistic of coefficient movement indicates a predominance in one direction and is made smaller when the statistic indicates a situation in which the direction is changing (e.g., a "random walk" as shown in FIG. 2). This is advantageous because it may be possible to accomplish convergence of the input signal at different speeds and depths depending on the different characteristics of the input signal at different times.

Equation (2) expresses a method for computing a frequency domain filter coefficient for a frequency bin m of a next sample block k+1, but in a manner that adjusts the step size over each sample block and for each frequency bin.

$$w_m^f(k+1) = \lambda_m w_m^f(k) + A_m(k)\mu_m \frac{x_m^{f*}(k)e_m^f(k)}{\left|x_m^f(k)\right|\left|x_m^f(k)\right|_{max}} \quad (2)$$

Equation (2) is similar to equation (1); however, the default step size $\mu_m$ of frequency bin m is multiplied by a sample block-specific adjustment factor $A_m(k)$ for the frequency bin m which is computed by the step size adjustment block 114 (e.g., according to equation (3) below). In one embodiment, the default step size $\mu_m$ is user-selectable and, advantageously, the user may select a relatively larger value than without the dynamic step size adjustment embodiments described herein because the embodiments may adjust the step size downward as needed. In other embodiments, the complex conjugate of the error signal rather than of the input signal may be employed to compute the coefficient for the next sample block.

The statistic of coefficient movement analysis block 112 maintains a history of coefficient movement based on the received frequency domain input signal $x_m^f(k)$ and the frequency domain error signal $e_m^f(k)$ over time and uses the history to compute one or more statistics of coefficient movement. The statistic of coefficient movement analysis block 112 analyzes the statistic and, based on the analysis, the step size adjustment block 114 computes the M adjustment factors $A_m(k)$ and uses them to dynamically adjust the M step sizes 116 associated with the M frequency bins for provision to the frequency domain coefficient update block 106 for use in updating the frequency domain coefficients 122, embodiments of which are described below.

As an example, in one embodiment, the statistic of coefficient movement is, for each frequency bin m, a count of signed directions of movement of the frequency domain filter coefficient over time, and the sample block-specific and frequency bin-specific adjustment factor $A_m(k)$ is expressed in equation (3)

$$A_m(k) = \frac{DirectionCount_m}{K} * G \quad (3)$$

where $DirectionCount_m$ is a sum of signed directions of coefficient movement for the last K sample blocks for frequency bin m, and G is a predetermined gain value. In one embodiment, K is 128 and G is 2, although other embodiments are contemplated with other values of K and G. In one embodiment, the frequency domain input signal $x_m^f(k)$ and the frequency domain error signal $e_m^f(k)$ are complex values, and a separate $DirectionCount_m$ is maintained for the real and imaginary components.

Although FIG. 1 describes an embodiment in which the adaptive filter 100 is a finite impulse response (FIR) filter, other embodiments are contemplated in which an infinite impulse response (IIR) filter or a lattice filter is employed. In one embodiment, the frequency domain adaptive filter 100 comprises a digital signal processor (DSP) programmed to perform operations of adaptive filter embodiments described herein.

FIG. 2 is an example graph illustrating a random walk occurrence of a frequency domain adaptive filter in accordance with embodiments of the present disclosure. FIG. 2 is a parametric plot of a complex filter coefficient of a single frequency bin of an adaptive filter over time. Time is the independent parameter and is increasing. The real component of the coefficient is plotted on the horizontal axis and the imaginary component of the coefficient is plotted on the vertical axis, both as a function of the increasing time parameter. With respect to FIG. 2, the sign (positive or negative) of the change between the current value of the coefficient and the next value of the coefficient (e.g., as computed via equation (1) or equation (2)) is referred to as the direction of coefficient movement. The direction of coefficient movement may be different in the real and the imaginary components of the coefficient. More generally, filter coefficient movement refers to the direction and/or distance of a change of adaptive filter coefficients between a current and next value of the coefficients.

At time=0, both the real and imaginary components of the complex filter coefficient are zero, as shown. As time increases, the direction of movement of the imaginary component is almost entirely monotonically positive, i.e., it increases (to approximately 2.7). As time increases, the direction of movement of the real component is also positive (to about 0.35), but then begins to fluctuate between positive and negative (between about 0.35 and 0.4) for a time. That is, the direction of coefficient movement of the real component is not predominantly the same during the time. This is referred to as a "random walk" of the real component, as shown. After the random walk, as time increases, the direction of movement of the real component is negative (to about −1.2). A significant occurrence of random walks of frequency domain coefficients during adaptation of an adaptive filter has been observed. The random walks may be attributable to numerical error, uncorrelated noise (e.g., door slam or tongue click signal disturbance), and/or convergence overshoot.

To improve adaptive filter performance, embodiments of a frequency domain adaptation apparatus and method that dynamically varies step size are described. In one embodiment, for each frequency bin, a statistic (e.g., a count of the direction of coefficient movement) is maintained. The step size is dynamically adjusted based on analysis of the statistic (e.g., when the direction count is toward a same direction, then the step size is increased for the frequency bin; otherwise, the step size is reduced). Advantageously, by dynamically adjusting the step size of each frequency bin of the adaptive filter 100 based on a statistical analysis of filter coefficient movement, the degree and/or occurrence of random walks may be reduced and the adaptive filter 100 may converge faster and deeper. In one embodiment, one or more adaptive filters that employ the dynamic step size (or leakage) adjustment are used in an active noise cancellation (ANC) system (e.g., of FIG. 7, to generate an anti-noise signal and/or to estimate an electro-acoustic path of an audio device, such as a mobile phone or headset) to improve the ANC gain. Generally, a statistic is a measure of an attribute of a sample, e.g., mean, minimum, maximum, sum/count, standard deviation.

Figure 3:
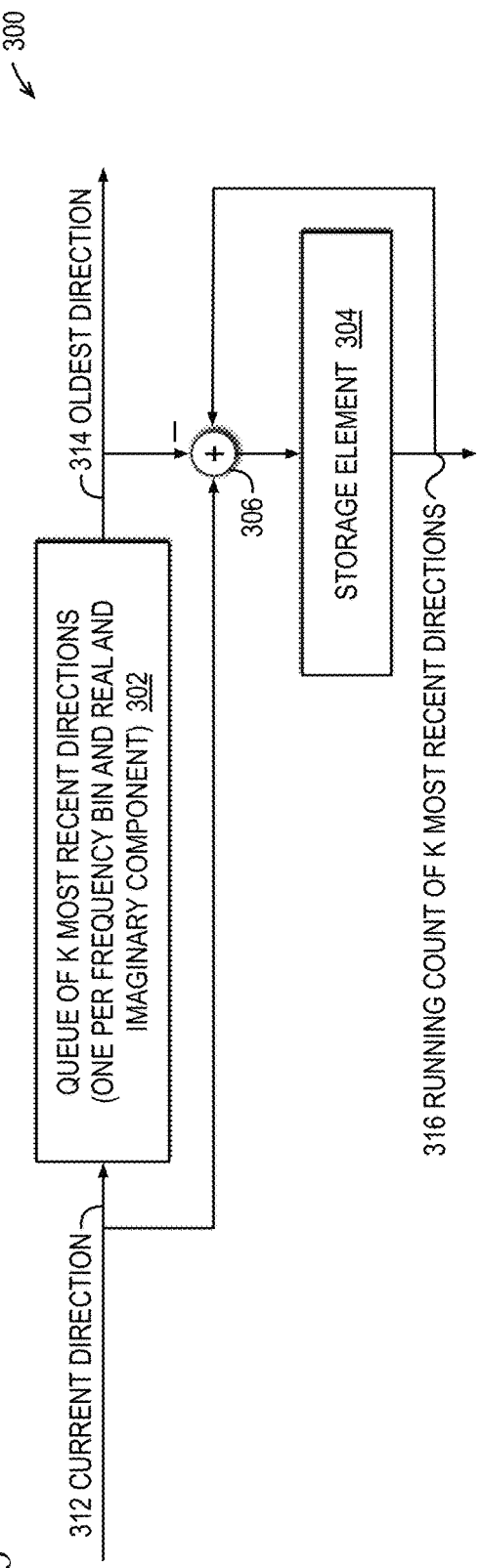
FIG. 3 is an example block diagram of an apparatus for maintaining a statistic of coefficient movement in accordance with embodiments of the present disclosure.

FIG. 3 is an example block diagram of an apparatus 300 for maintaining a statistic of coefficient movement in accordance with embodiments of the present disclosure. The apparatus 300 includes a K-deep queue 302, a summing element 306, and storage element 304 for storing a running count 316, or sum, of the K most recent directions. Initially, all the elements of the queue 302 are reset to zero and the storage element 304 is reset to zero. Each sample block k, a current direction 312 (e.g., a positive one or negative one) is pushed into the queue 302, an oldest direction 314 is removed from the queue 302, and the summing element 306 adds the current direction 312 to and subtracts the oldest direction 314 from the current running count 316 to generate a new running count to store into storage element 304. Preferably, M different instances of the apparatus 300, one per frequency bin m, are present in the frequency domain adaptation block 102, where M is the number of frequency bins. In this manner, a direction count statistic (e.g., running count 316) is maintained for each frequency bin m that may be analyzed to dynamically adjust the step size associated with the frequency bin, e.g., for use as the DirectionCount$_m$ of equation (3) above.

In one embodiment, the current direction is determined based on the sign of a complex product of the frequency domain error signal $e_m^f(k)$ of the current frequency bin m and the corresponding complex conjugate of the frequency domain input signal $x_m^{f*}(k)$, e.g., similar to the manner described below with respect to block 504 of FIG. 5. In one embodiment, the current direction is determined based on the sign of a complex product of the frequency domain input signal $x_m^f(k)$ of the current frequency bin m and the corresponding complex conjugate of the frequency domain error signal $e_m^{f*}(k)$.

Figure 4:
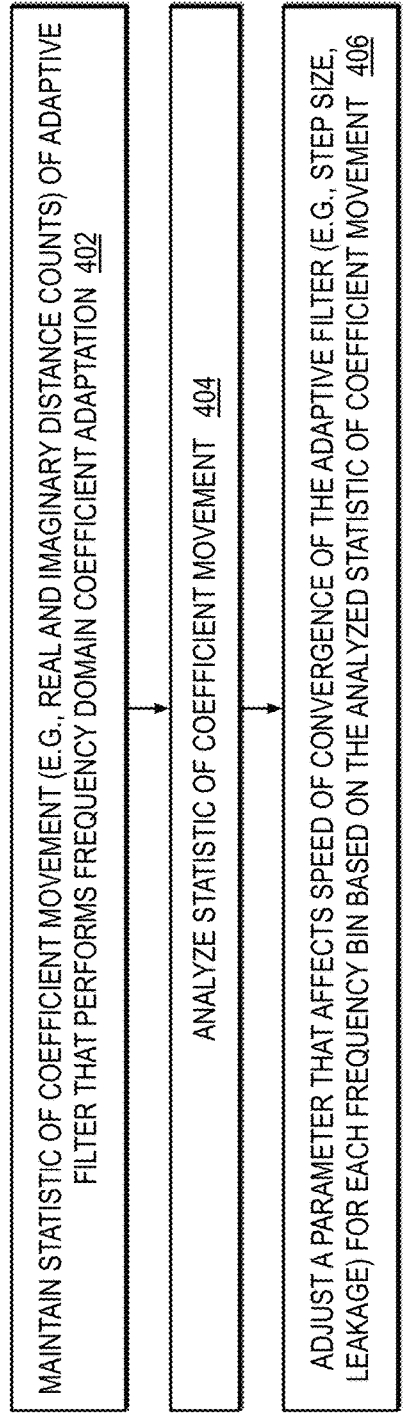
FIG. 4 is an example flowchart illustrating operation of a frequency domain adaptation block in accordance with embodiments of the present disclosure.

FIG. 4 is an example flowchart illustrating operation of the frequency domain adaptation block 102 in accordance with embodiments of the present disclosure. Operation begins at block 402.

At block 402, the frequency domain adaptation block 102 maintains a statistic of coefficient movement of an adaptive filter (e.g., 100 of FIG. 1). In one embodiment, the statistic comprises real and imaginary direction counts for each frequency bin. Operation proceeds to block 404.

At block 404, the frequency domain adaptation block 102 analyzes the statistic of coefficient movement. For example, the adaptation block 102 may look for a change in direction of the coefficient or look for the presence of a predominant direction of movement of the coefficient, as described in more detail below. Operation proceeds to block 406.

At block 406, the frequency domain adaptation block 102 adjusts a parameter that affects the speed of convergence of the adaptive filter 100 for each frequency bin based on the analyzed statistic of coefficient movement. In one embodiment, the parameter is the step size. In another embodiment, the parameter is a leakage factor. In one embodiment, under certain conditions the step size may be set to zero in order to effectively freeze the adaptive filter from adapting.

Figure 5:
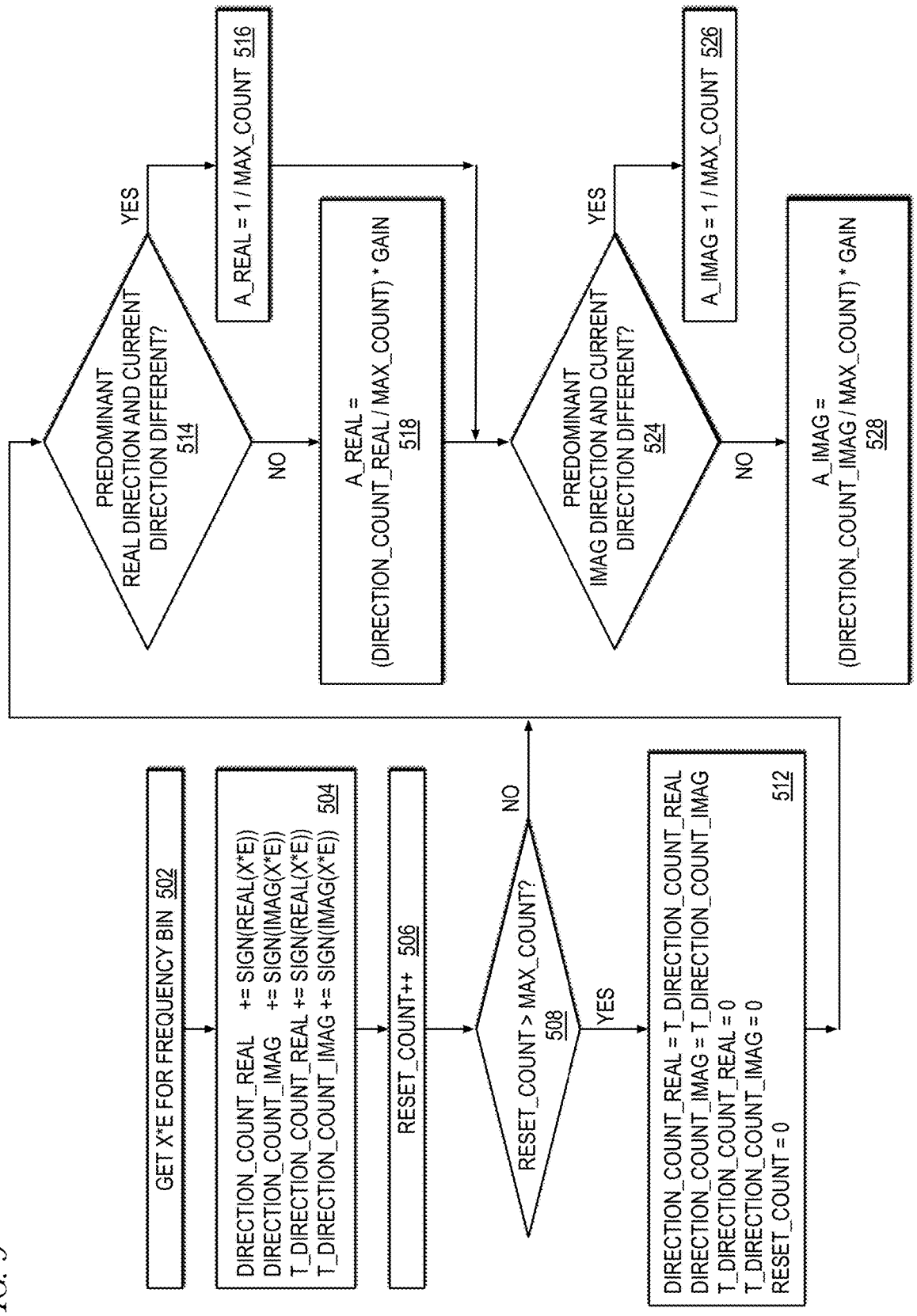
FIG. 5 is an example flowchart illustrating operation of a frequency domain adaptation block in accordance with embodiments of the present disclosure.

FIG. 5 is an example flowchart illustrating operation of the frequency domain adaptation block 102 in accordance with embodiments of the present disclosure. The operation described in FIG. 5 is performed for each frequency bin m of the M frequency bins for each sample block k. Operation begins at block 502.

At block 502, the adaptation block 102 computes a complex product of the frequency domain error signal $e_m^f(k)$ of the current frequency bin m and the corresponding complex conjugate of the frequency domain input signal $x_m^{f*}(k)$. Operation proceeds to block 504.

At block 504, the sign of the real component of the complex product computed at block 502 is added to a counter direction_count_real and to a counter t_direction_count_real, and the sign of the imaginary component of the complex product computed at block 502 is added to a counter direction_count_imag and to a t_counter direction_count imag. Preferably, each of the sums is performed in a saturating manner, e.g., saturates above at an upper limit (e.g., MAX_COUNT) and saturates below at the opposite of the upper limit (e.g., –MAX_COUNT). Operation proceeds to block 506.

At block 506, a counter reset count is incremented. In one embodiment, a single reset_count is maintained for all the frequency bins. Operation proceeds to decision block 508.

At decision block 508, the adaptation block 102 determines whether reset count is greater than a value max count. If so, operation proceeds to block 512; otherwise, operation proceeds to decision block 514. In one embodiment, max_count is a predetermined value (e.g., 128, although other values are contemplated).

At block 512, direction_count_real is assigned t_direction_count_real, and direction_count_imag is assigned t_direction_count_imag. Additionally, reset_count, t_direction_count_real, and t_direction_count_imag are reset to zero. Operation proceeds to decision block 514.

At decision block 514, the adaptation block 102 determines whether there is a predominant real direction of the current frequency bin m and the current direction is different than the predominant direction. If so, operation proceeds to block 516; otherwise, operation proceeds to block 518.

At block 516, the adaptation block 102 computes the step size adjustment factor according to equation (4).

$$A_m(k)\_real = \frac{1}{\text{max\_count}} \quad (4)$$

Per equation (4), the adjustment factor is a minimum value that is between zero and one and will thereby reduce the default step size for the frequency bin m. As described above, a small step size may be desirable when the current movement direction is different than the predominant direction. The operation proceeds to decision block 524.

At block 518, the adaptation block 102 computes the step size adjustment factor according to equation (5).

$$A_m(k)\_real = \frac{\text{direction\_count\_real}_m + 1}{\text{max\_count}} * G \quad (5)$$

Per equation (5), the adjustment factor approximately proportionally to the amount that one direction predominates over the other during the most recent sample blocks (e.g., the most recent max_count sample blocks). As may be observed, the adjustment factor will be greater than one and thereby increase the default step size for frequency bin m if the direction_count real is sufficiently large (e.g., greater than max_count/gain), e.g., if one direction predominates sufficiently over the other. Otherwise, the adjustment factor will be less than one but greater than the minimum value computed at block 516 (unless the magnitude of the difference between the number of positive and negative directions is one, in which case the adjustment factor will be the minimum value). The operation proceeds to decision block 524.

Figure 10:
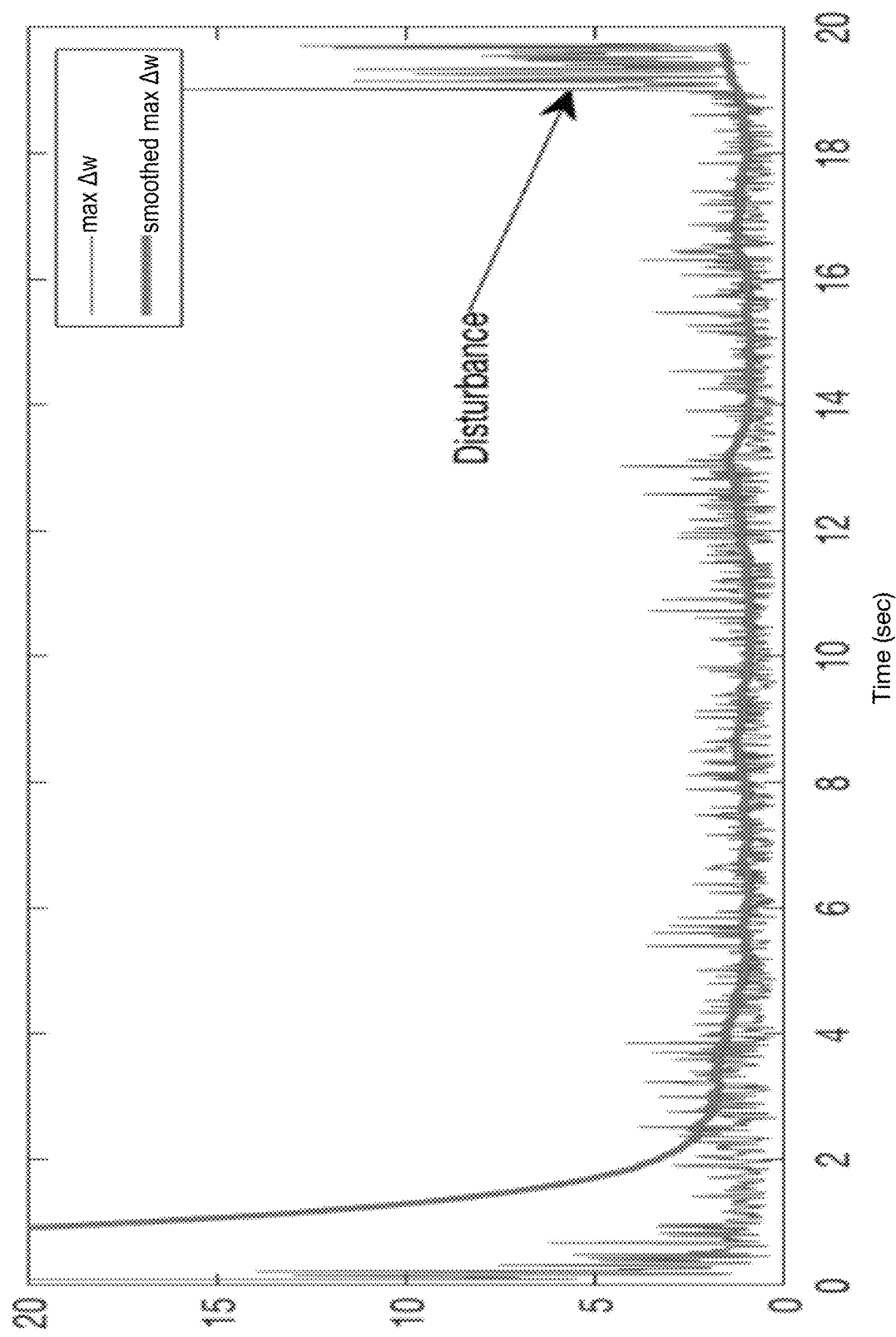
FIG. 10 is an example graph of a maximum distance of coefficient movement among the current frequency bins and a smoothed version of the maximum distance of coefficient movement maintained over time in accordance with embodiments of the present disclosure.

At decision block 524, the adaptation block 102 determines whether there is a predominant imaginary direction of the current frequency bin m and the current direction is different than the predominant direction. If so, operation proceeds to block 526; otherwise, operation proceeds to block 528. In one embodiment, the adaptation block 102 determines a maximum distance of coefficient movement $$\text{(e.g., } \frac{x_m^{f*}(k)e_m^f(k)}{|x_m^f(k)||x_m^f(k)|_{max}},$$

referred to as $\max(\Delta w_m^f(k))$) among the current frequency bins and also maintains a smoothed version of the maximum distance of coefficient movement, as shown in FIG. 10 as "max $\Delta w$" and "smoothed max $\Delta w$", respectively (e.g., observed through the most recent max_count sample blocks). At decision block 524 (and decision block 514), the adaptation block 102 also determines whether the current maximum coefficient movement distance exceeds a product of the smoothed version and a tunable scaling factor that adjusts the sensitivity of the adaptive filter to ambient disturbance. If so, the adaptation block 102 sets the adjustment factor to zero in order to freeze the coefficient from being changed, i.e., to cause the speed of convergence to be effectively zero. As shown in FIG. 10, at approximately 19 seconds in the graph, there is a strong disturbance that causes max $\Delta w$ to increase significantly above the smoothed max $\Delta w$, which triggers the disturbance protection mechanism that sets the adjustment factor to zero to freeze the coefficient from being changed. Such a disturbance protection mechanism may significantly improve the performance of the adaptive filter and performance of its system, e.g., may improve, in the presence of a disturbance, the ANC gain performance of an ANC system that uses a filter with the protection mechanism.

At block 526, the adaptation block 102 computes the step size adjustment factor according to a manner similar to equation (4) above but for the imaginary component of the step size.

At block 528, the adaptation block 102 computes the step size adjustment factor according to a manner similar to equation (5) above but for the imaginary component of the step size using the direction_count_imag for the frequency bin m.

The embodiment of FIG. 5 approximates the embodiment of FIG. 3. The embodiment of FIG. 5 may require less memory because it does not require a queue (e.g., queue 302 of FIG. 3, for each frequency bin) and instead approximates a queue by periodically resetting the direction count to the direction count over the last period (e.g., over MAX_COUNT sample blocks). Thus, whereas the embodiment of FIG. 3 has a smoothed value of the direction count over time, the embodiment of FIG. 5 embodies a slightly more discretized value of the direction count.

Figure 6A:
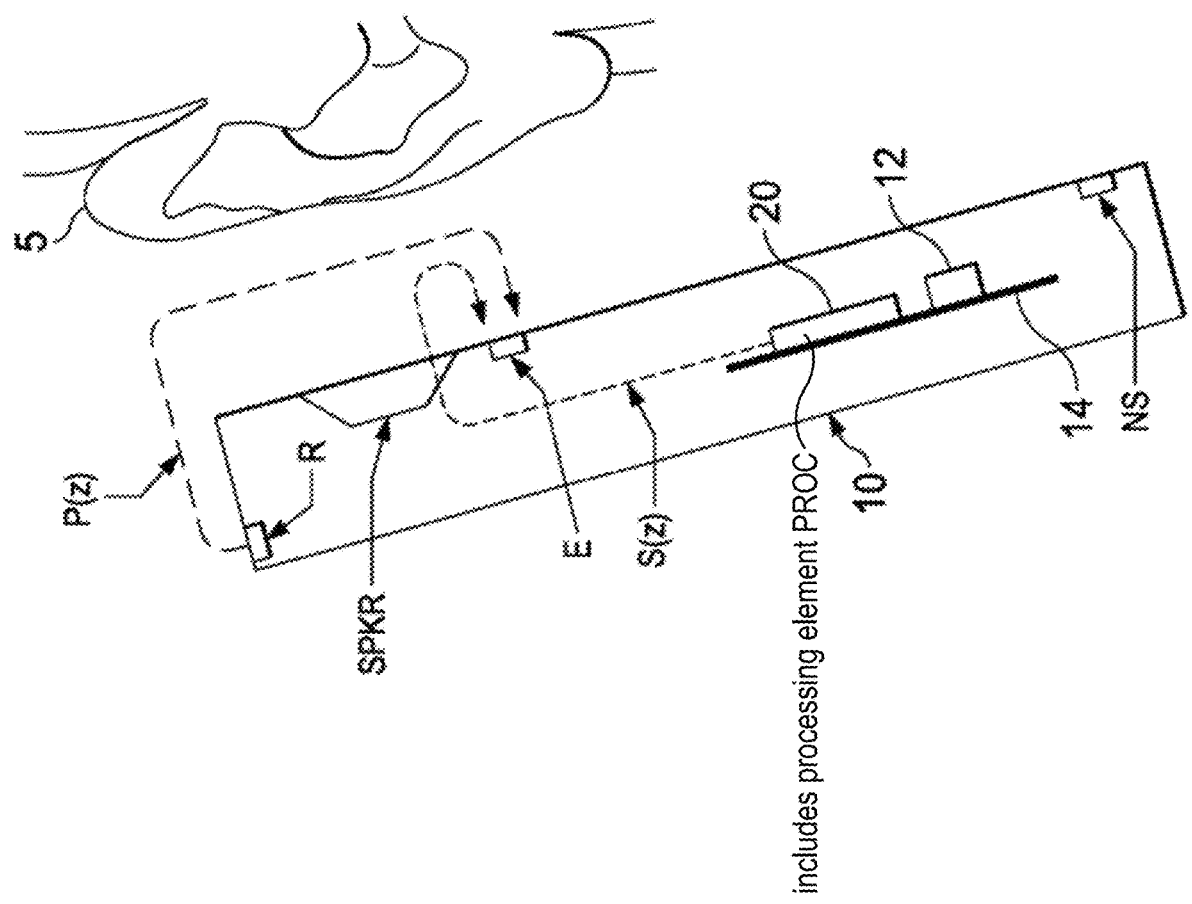
FIG. 6A is an example wireless telephone in accordance with embodiments of the present disclosure shown in proximity to a human ear.

FIG. 6A illustrates an example wireless telephone 10 in accordance with embodiments of the present disclosure shown in proximity to a human ear 5. Wireless telephone 10 is an example of an ANC-enabled portable audio device in which dynamically adjustable step size or leakage parameter frequency domain adaptive filter techniques in accordance with embodiments of this disclosure may be employed. Wireless telephone 10 may include a transducer such as a speaker SPKR that reproduces distant speech received by wireless telephone 10, along with other local audio events such as ringtones, stored audio program material, injection of near-end speech (i.e., the speech of the user of wireless telephone 10) to provide a balanced conversational perception, and other audio that requires reproduction by wireless telephone 10, such as sources from webpages or other network communications received by wireless telephone 10 and audio indications such as a low battery indication and other system event notifications. A near-speech microphone NS may be provided to capture near-end speech, which is transmitted from wireless telephone 10 to the other conversation participant(s).

Wireless telephone 10 may include ANC circuits and features that inject an anti-noise signal into speaker SPKR to improve intelligibility of the distant speech and other audio reproduced by speaker SPKR. A reference microphone R may be provided for measuring the ambient acoustic environment, and may be positioned away from the typical position of a user's mouth, so that the near-end speech may be minimized in the signal produced by reference microphone R. Another microphone, error microphone E, may be provided in order to further improve the ANC operation by providing a measure of the ambient audio combined with the audio reproduced by speaker SPKR close to ear 5, when wireless telephone 10 is in close proximity to ear 5. In other embodiments, additional reference and/or error microphones may be employed. Circuit 14 within wireless telephone 10 may include an audio CODEC integrated circuit (IC) 20 that receives the signals from reference microphone R, near-speech microphone NS, and error microphone E and interfaces with other integrated circuits such as a radio-frequency (RF) integrated circuit 12 having a wireless telephone transceiver. In some embodiments of the disclosure, the circuits and techniques disclosed herein may be incorporated in a single integrated circuit that includes control circuits and other functionality for implementing the entirety of the portable audio device, such as an MP3 player-on-a-chip integrated circuit. In these and other embodiments, the circuits and techniques disclosed herein may be implemented partially or fully in software and/or firmware embodied in computer-readable media and executable by a controller or other processing device, such as processing element PROC of IC 20 that may perform operations for implementing a frequency domain adaptive filter as described herein. A processing element is an electronic circuit capable of fetching program instructions stored in addressed memory locations and executing the fetched instructions. IC 20 may also include a non-volatile memory.

In general, the ANC system of portable audio device 10 measures ambient acoustic events (as opposed to the output of speaker SPKR and/or the near-end speech) impinging on reference microphone R, and by also measuring the same ambient acoustic events impinging on error microphone E, ANC processing circuits of wireless telephone 10 adapt an anti-noise signal generated from the output of reference microphone R to have a characteristic that minimizes the amplitude of the ambient acoustic events at error microphone E. Because an acoustic path P(z) extends from reference microphone R to error microphone E, ANC circuits are effectively estimating acoustic path P(z) while removing effects of an electro-acoustic path S(z) that represents the response of the audio output circuits of CODEC IC 20 and the acoustic/electric transfer function of speaker SPKR including the coupling between speaker SPKR and error microphone E in the particular acoustic environment, which may be affected by the proximity and structure of ear 5 and other physical objects and human head structures that may be in proximity to wireless telephone 10, when wireless telephone 10 is not firmly pressed to ear 5. While the illustrated wireless telephone 10 includes a two-microphone ANC system with a third near-speech microphone NS, some aspects and embodiments of the present disclosure may be practiced in a system that does not include separate error and reference microphones, or a wireless telephone that uses near-speech microphone NS to perform the function of the reference microphone R. Also, in portable audio devices designed only for audio playback, near-speech microphone NS will generally not be included, and the near-speech signal paths in the circuits described in further detail below may be omitted, without changing the scope of the disclosure, other than to limit the options provided for input to the microphone covering detection schemes.

FIG. 6B depicts an example of a wireless telephone 10 having a headset assembly 13 coupled to it via audio port 15 in accordance with embodiments of the present disclosure. Audio port 15 may be communicatively coupled to RF integrated circuit 12 and/or CODEC IC 20, thus permitting communication between components of headset assembly 13 and one or more of RF integrated circuit 12 and/or CODEC IC 20 (e.g., of FIG. 6A). In other embodiments, the headset assembly 13 may connect wirelessly to the wireless telephone 10, e.g., via Bluetooth or other short-range wireless technology. As shown in FIG. 6B, headset assembly 13 may include a combox 16, a left headphone 18A, and a right headphone 18B. As used in this disclosure, the term "headset" broadly includes any loudspeaker and structure associated therewith that is intended to be mechanically held in place proximate to a listener's ear canal, and includes without limitation earphones, earbuds, and other similar devices. As more specific examples, "headset" may refer but is not limited to intra-concha earphones, supra-concha earphones, and supra-aural earphones.

Combox 16 or another portion of headset assembly 13 may have a near-speech microphone NS to capture near-end speech in addition to or in lieu of near-speech microphone NS of wireless telephone 10. In addition, each headphone 18A, 18B may include a transducer, such as speaker SPKR, that reproduces distant speech received by wireless telephone 10, along with other local audio events such as ringtones, stored audio program material, injection of near-end speech (i.e., the speech of the user of wireless telephone 10) to provide a balanced conversational perception, and other audio that requires reproduction by wireless telephone 10, such as sources from webpages or other network communications received by wireless telephone 10 and audio indications such as a low battery indication and other system event notifications. Each headphone 18A, 18B may include a reference microphone R for measuring the ambient acoustic environment and an error microphone E for measuring of the ambient audio combined with the audio reproduced by speaker SPKR close to a listener's ear when such headphone 18A, 18B is engaged with the listener's ear. In some embodiments, CODEC IC 20 may receive the signals from reference microphone R, near-speech microphone NS, and error microphone E of each headphone and perform adaptive noise cancellation for each headphone as described herein.

In other embodiments, headset assembly 13 is an example of an ANC-enabled portable audio device in which techniques in accordance with embodiments of this disclosure may be employed. A CODEC IC having a processing element PROC and non-volatile memory similar to CODEC IC 20 of FIG. 6A or another circuit may be present within headset assembly 13, communicatively coupled to reference microphone R, near-speech microphone NS, and error microphone E, and configured to perform active noise cancellation as described herein. In such embodiments, an acoustic path having a transfer function P(z) that extends from the reference microphone R to the error microphone E similar to that described with respect to FIG. 6A may also exist with respect to the headset assembly 13. Additionally in such embodiments, an electro-acoustic path having a transfer function S(z) that represents the response of the audio output circuits of the CODEC IC of the headset assembly 13 and the acoustic/electric transfer function of speaker SPKR including the coupling between speaker SPKR and error microphone E, similar to those described with respect to FIG. 6A, may also exist with respect to the headset assembly 13.

Figure 7:
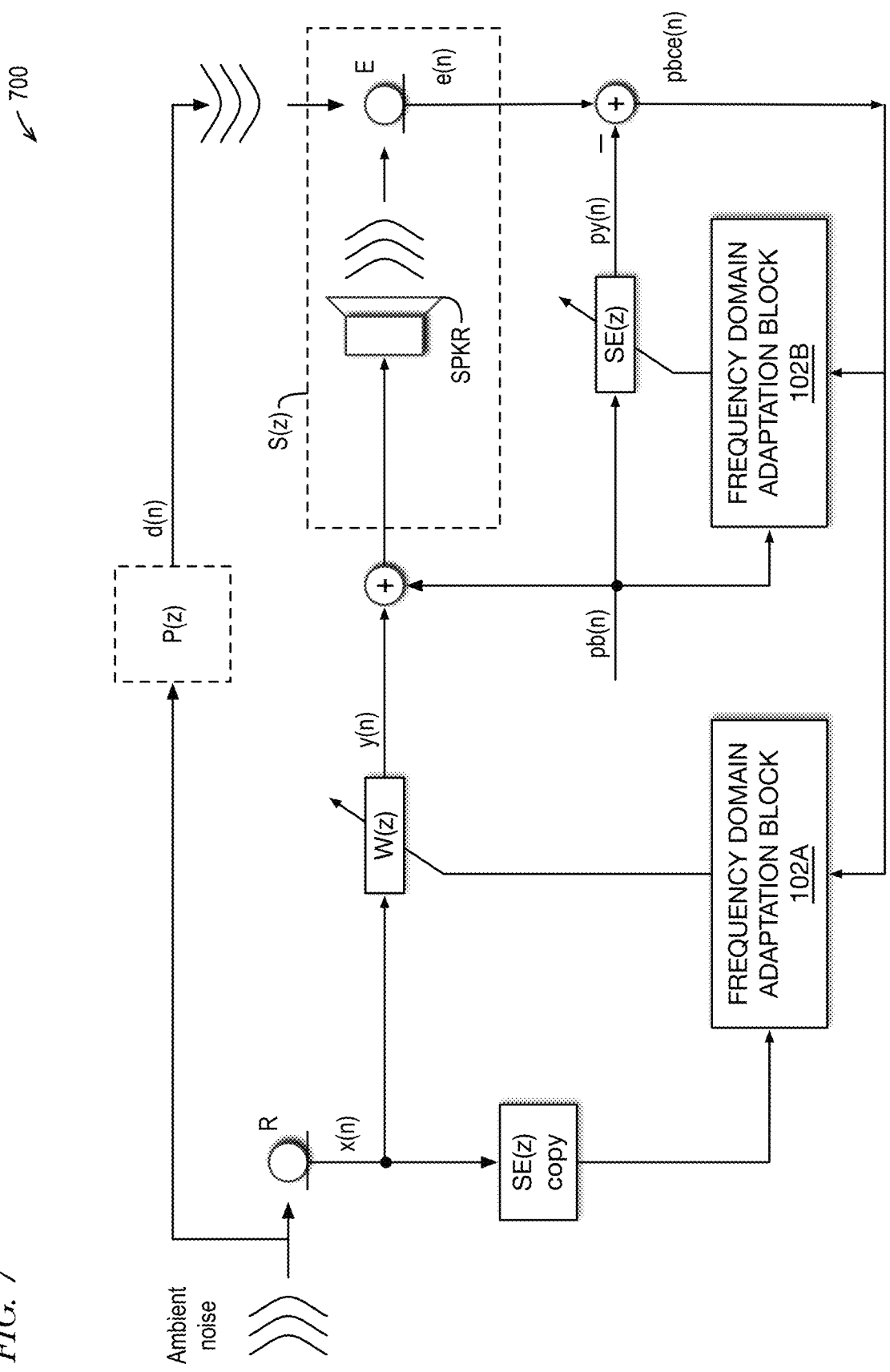
FIG. 7 is an example block diagram of an ANC system that includes frequency domain adaptation blocks that dynamically adjust step sizes or leakage parameters to improve speed and depth of adaptive filter convergence in accordance with embodiments of the present disclosure.

FIG. 7 is an example block diagram of an ANC system 700 that includes frequency domain adaptation blocks 102A and 102B that dynamically adjust step sizes or leakage parameters to improve speed and depth of convergence of adaptive filters W(z) and SE(z), respectively, each of which may be an instance of adaptive filter 100 of FIG. 1, in accordance with embodiments of the present disclosure. The ANC system 700 may be employed in an ANC-enabled portable audio device such as those described with respect to FIGS. 6A and 6B, for example.

The ANC system 700 includes a speaker SPKR, a reference microphone R and an error microphone E (e.g., of FIG. 6A or FIG. 6B). Shown in FIG. 7 is an acoustic path P(z) that extends from reference microphone R to error microphone E, as described above with respect to FIGS. 6A and 6B, as well as an electro-acoustic path S(z) that represents the response of the audio output circuits of CODEC IC 20 and the acoustic/electric transfer function of speaker SPKR. Ambient noise impinges upon reference microphone R which responsively generates a reference microphone signal x(n). The ambient noise passes through acoustic path P(z) and emerges as an acoustic ambient noise signal d(n) that impinges on error microphone E, which generates an error microphone signal e(n) in response to acoustic ambient noise signal d(n) and the output of speaker SPKR. Preferably, the ANC system 700 also includes analog-to-digital converters (ADC) and digital-to-analog (DAC) (not shown). For example, an ADC may convert an analog signal generated by the reference microphone R into the digital reference signal x(n), an ADC may convert an analog signal generated by the error microphone E into the digital error signal e(n), and a DAC may convert a digital signal output by the summing element that sums the digital anti-noise signal y(n) and the digital playback signal pb(n) into an analog signal that is provided (e.g., through an amplifier) to the speaker SPKR.

The ANC system 700 also includes an adaptive anti-noise filter W(z) that adaptively models a transfer function that is the quotient of acoustic path P(z) and electro-acoustic path S(z). Adaptive filter W(z) receives and filters reference microphone signal x(n) to generate anti-noise signal y(n). The goal is that when anti-noise signal y(n) passes through electro-acoustic path S(z), it will emerge from speaker SPKR as an acoustic signal that essentially cancels acoustic ambient noise signal d(n) at error microphone E. The filter coefficients for adaptive filter W(z) are provided by a frequency domain adaptation block 102A. The frequency domain adaptation block 102A dynamically adjusts the step size or leakage parameter of adaptive filter W(z) in the frequency domain by analyzing a statistic of coefficient movement, embodiment of which are described herein.

The ANC system 700 also includes an adaptive electro-acoustic path estimation filter SE(z) and a copy of electro-acoustic path estimation filter SE(z) copy. Adaptive filter SE(z) estimates the transfer function of path S(z). Adaptive filter SE(z) filters a playback signal pb(n) to generate a signal py(n) that represents the playback audio that is expected to be delivered to error microphone E. The filter coefficients for adaptive filters SE(z) and SE(z) copy are provided by a frequency domain adaptation block 102B. The frequency domain adaptation block 102B dynamically adjusts the step size or leakage parameter in the frequency domain by analyzing a statistic of coefficient movement, embodiment of which are described herein. Adaptive filter SE(z) copy filters reference microphone signal x(n) to generate an output signal that is provided to frequency domain adaptation block 102A.

A first summing element combines playback signal pb(n) and anti-noise signal y(n) to generate a signal provided to speaker SPKR that responsively generates audio output that impinges upon error microphone E. In some embodiments the first summing element may also combine a distant speech signal and/or a near speech signal. A second summing element subtracts the output signal py(n) of filter SE(z) from error microphone signal e(n) to generate a playback corrected error signal pbce(n). The pbce(n) signal is equal to error microphone signal e(n) after removal of playback signal pb(n) as filtered by filter SE(z) to represent the expected playback audio delivered to error microphone E. Stated alternatively, the pbce(n) signal includes the content of error microphone signal e(n) that is not due to the playback signal pb(n).

Frequency domain adaptation block 102A performs adaptation of the coefficients for adaptive filter W(z), including dynamically adjusting step sizes or leakage parameters based on analysis of a statistic of coefficient movement, based on frequency domain versions of the output signal of filter SE(z) copy and playback corrected error signal pbce(n). Frequency domain adaptation block 102B performs adaptation of the coefficients for filter SE(z) and SE(z) copy, including dynamically adjusting step sizes or leakage parameters based on analysis of a statistic of coefficient movement, based on frequency domain versions of on playback signal pb(n) and playback corrected error signal pbce(n). In other embodiments, the adaptive filter 100 may be employed to estimate a model of an acoustic path (commonly referred to as L) from the speaker SPKR to the reference microphone R, which may be employed in the ANC system to compensate for acoustic energy generated by the speaker SPKR that is picked up by the reference microphone R and transduced as a component of the reference signal x(n). Although an embodiment of an ANC system is shown in FIG. 7, other embodiments are contemplated that use one or more adaptive filters that include a frequency domain adaptation block that performs dynamic step size or leakage parameter adjustment based on analysis of a statistic of coefficient movement.

Although an embodiment of an adaptive filter that includes a frequency domain adaptation block that performs dynamic step size or leakage parameter adaptation based on analysis of a statistic of coefficient movement employed in an ANC system such as ANC system 700 has been described, other applications may employ such an adaptive filter, such as channel identification, plant identification and control, echo cancellation, adaptive noise canceling, channel equalization, linear predictive coding, adaptive line enhancement, etc.

Figure 8:
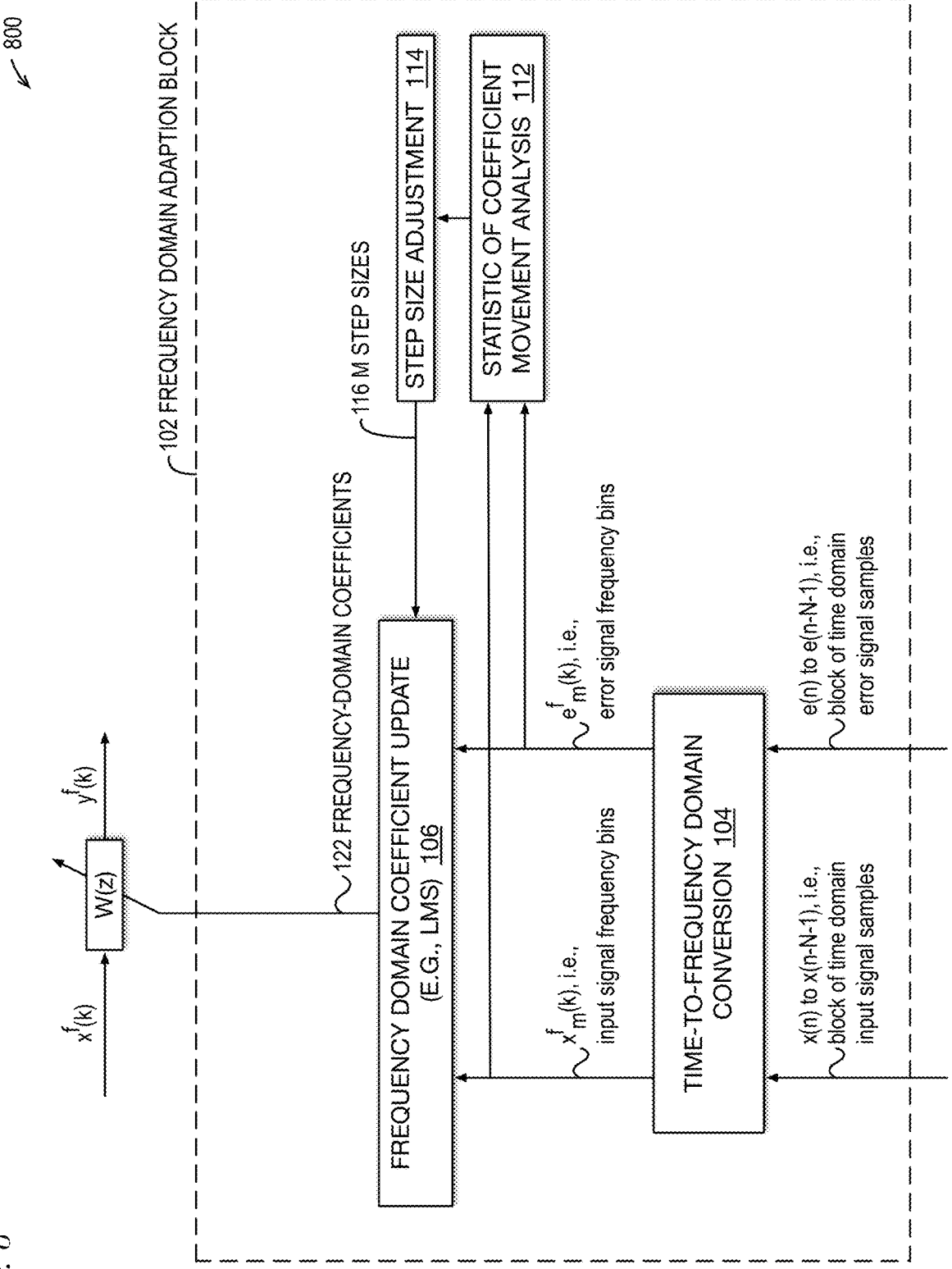
FIG. 8 is an example block diagram of an adaptive filter that includes a frequency domain coefficient adaptation block that dynamically adjusts a speed of convergence parameter based on an analysis of a statistic of coefficient movement in accordance with embodiments of the present disclosure.

FIG. 8 is an example block diagram of an adaptive filter 800 that includes a frequency domain coefficient adaptation block 102 that dynamically adjusts a speed of convergence parameter (e.g., step size, leakage) based on an analysis of a statistic of coefficient movement to improve speed and depth of convergence in accordance with embodiments of the present disclosure. The adaptive filter 800 includes a frequency domain filter W(z) that receives a frequency domain input signal $x^f(k)$ and frequency domain filter coefficients 122 from the frequency domain adaptation block 102. For each sample block k, the frequency domain filter W(z) applies the frequency domain filter coefficients 122 to the frequency domain input signal $x^f(k)$ to produce a frequency domain output signal $y^f(k)$. The frequency domain output signal $y^f(k)$ may be converted into a time domain output signal, e.g., via an IFFT block (not shown). In many respects, the frequency domain adaptation block 102 is similar to the frequency domain adaptation block 102 of FIG. 1, except that the frequency domain coefficients 122 are provided directly to the frequency domain filter W(z) rather than being first converted to time domain coefficients. Nevertheless, the frequency domain adaptation block 102 of FIG. 8 also performs dynamic step size or leakage parameter adaptation based on analysis of a statistic of coefficient movement. The adaptive filter 100 of FIG. 1 may be characterized as a "delay-less" filter, whereas the adaptive filter 800 of FIG. 8 may include delay due to conversion of a time domain input signal to a frequency domain input signal. Nevertheless, it may be observed from FIG. 8 that an adaptive filter that performs dynamic step size or leakage parameter adaptation based on analysis of a statistic of coefficient movement may include a frequency domain filter and may be employed in various applications, such as an ANC system or other application that is tolerable of delay in its adaptive filter.

Figure 9:
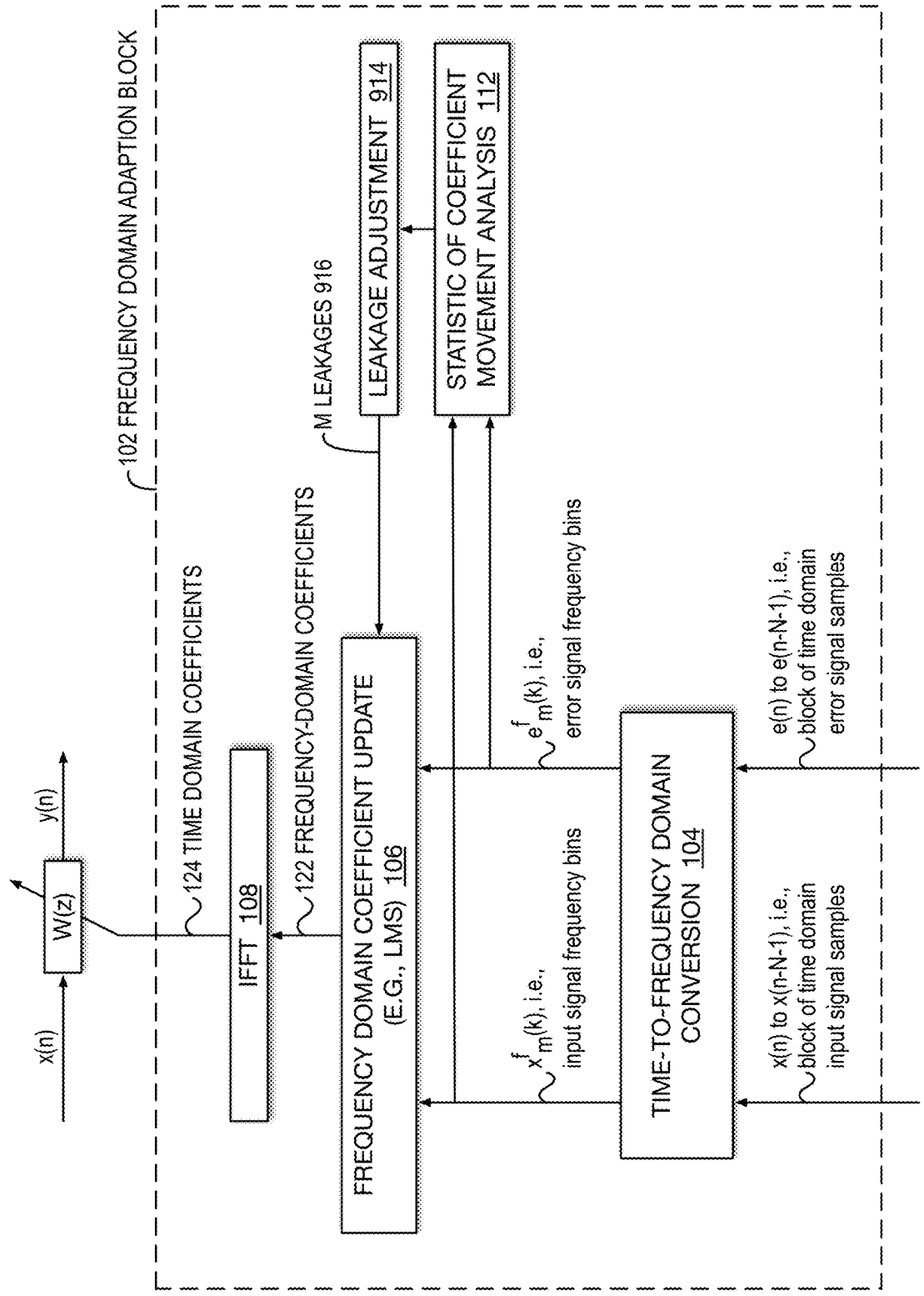
FIG. 9 is an example block diagram of an adaptive filter that includes a frequency domain coefficient adaptation block that dynamically adjusts a leakage parameter based on an analysis of a statistic of coefficient movement to improve speed and depth of convergence in accordance with embodiments of the present disclosure.

FIG. 9 is an example block diagram of an adaptive filter 900 that includes a frequency domain coefficient adaptation block 102 that dynamically adjusts a leakage parameter based on an analysis of a statistic of coefficient movement to improve speed and depth of convergence in accordance with embodiments of the present disclosure. The leakage parameter is a value between zero and one, typically close to one, that may affect the speed of convergence of an adaptive filter and that is generally employed to increase the stability of the adaptive filter by preventing unbounded growth of its coefficients. The adaptive filter 900 of FIG. 9 is similar in many respects to the adaptive filter 100 of FIG. 1. However, adaptive filter 900 includes a leakage adjustment block 914 that provides M leakages 916 to the frequency domain coefficient update block 106. The frequency domain coefficient update block 106 uses the frequency domain input signal $x_m^f(k)$ and frequency domain error signal $e_m^f(k)$, along with M leakages 916 associated with the M frequency bins received from the leakage adjustment block 914, to generate updated frequency domain coefficients 122. Equation (6) expresses a method for computing a frequency domain filter coefficient for a frequency bin m of a next sample block k+1, but in a manner that adjusts the leakage over each sample block and for each frequency bin.

$$w_m^f(k+1) = L_m(k)\lambda_m w_m^f(k) + \mu_m \frac{x_m^{f*}(k)e_m^f(k)}{\left|x_m^f(k)\right|\left|x_m^f(k)\right|_{max}} \quad (6)$$

Equation (6) is similar to equation (1); however, the default leakage $\lambda_m$ of frequency bin m is multiplied by a sample block-specific adjustment factor $L_m(k)$ for the frequency bin m. Based on the analysis by the statistic of coefficient movement analysis block 112, the leakage adjustment block 914 computes the M adjustment factors $L_m(k)$ and uses them to dynamically adjust the M leakages 916 associated with the M frequency bins for provision to the frequency domain coefficient update block 106 for use in updating the frequency domain coefficients 122. In one embodiment, the sample block-specific and frequency bin-specific adjustment factor $L_m(k)$ is expressed in equation (7)

$$L_m(k)\_real = 1 - \left(\frac{max\_count - direction\_count\_real_m}{max\_count}\right) * B \quad (7)$$

in which direction_count_real and max_count are similar entities to those described with respect to equation (5), and B is a gain value between zero and one. In one embodiment, in a manner analogous to that described with respect to FIG. 5, if there is no predominant direction of movement of the coefficient, then the leakage adjustment factor is set to zero since the need for protecting from instability is small because the step size is dynamically adjusted in each frequency bin. In one embodiment, if there is a predominant direction, then equation (7) may be used to compute the leakage adjustment factor and the step size is not adjusted based on the statistic of movement analysis. In other words, a weak leakage may be applied if the adaptive filter is moving in a predominant direction; otherwise, a relatively strong leakage may be applied.

It should be understood—especially by those having ordinary skill in the art with the benefit of this disclosure—that the various operations described herein, particularly in connection with the figures, may be implemented by other circuitry or other hardware components. The order in which each operation of a given method is performed may be changed, unless otherwise indicated, and various elements of the systems illustrated herein may be added, reordered, combined, omitted, modified, etc. It is intended that this disclosure embrace all such modifications and changes and, accordingly, the above description should be regarded in an illustrative rather than a restrictive sense.

Similarly, although this disclosure refers to specific embodiments, certain modifications and changes can be made to those embodiments without departing from the scope and coverage of this disclosure. Moreover, any benefits, advantages, or solutions to problems that are described herein with regard to specific embodiments are not intended to be construed as a critical, required, or essential feature or element.

Further embodiments likewise, with the benefit of this disclosure, will be apparent to those having ordinary skill in the art, and such embodiments should be deemed as being encompassed herein. All examples and conditional language recited herein are intended for pedagogical objects to aid the reader in understanding the disclosure and the concepts contributed by the inventor to furthering the art and are construed as being without limitation to such specifically recited examples and conditions.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

The invention claimed is:

1. A method, comprising:
analyzing, in a frequency domain, a statistic of coefficient movement of an adaptive filter; and
adjusting, in the frequency domain, a parameter that affects speed of convergence of the adaptive filter based on the analyzed statistic of filter coefficient movement; and
wherein the statistic of coefficient movement comprises a measure of an attribute of a sample of a change of adaptive filter coefficients between a current and next value of the coefficients.

2. The method of claim 1,
wherein the adaptive filter includes, for each frequency bin of a plurality of frequency bins, an associated:
coefficient;
statistic of coefficient movement; and
parameter that affects speed of convergence of the adaptive filter;
wherein said analyzing the statistic in the frequency domain comprises, for each frequency bin of the plurality of frequency bins, analyzing the statistic of coefficient movement associated with the frequency bin; and
wherein said adjusting the parameter in the frequency domain comprises, for each frequency bin of the plurality of frequency bins, adjusting the parameter associated with the frequency bin based on the analyzed statistic associated with the frequency bin.

3. The method of claim 2,
wherein said adjusting the parameter comprises decreasing the step size when the frequency bin is above a predetermined upper frequency bin.

4. The method of claim 2,
determining a current maximum distance of the filter coefficient movement among the frequency bins and maintaining a smoothed version of the maximum distance;
wherein said analyzing comprises determining a condition that is whether the current maximum distance exceeds a product of the smoothed version and a scaling factor; and
wherein said adjusting the parameter comprises setting the parameter to a value that causes the speed of convergence to be approximately zero when the condition is satisfied.

5. The method of claim 1,
wherein coefficients comprise complex numbers having a real part and an imaginary part;
wherein the statistic of coefficient movement comprises separate statistics for the real part of the coefficients and the imaginary part of the coefficients; and
wherein the parameter comprises separate parameters for the real part of the coefficients and the imaginary part of the coefficients.

6. The method of claim 1,
wherein the statistic comprises direction counts of the filter coefficient movement.

7. The method of claim 1,
wherein the parameter that affects speed of convergence is a step size.

8. The method of claim 7,
wherein said adjusting the parameter based on the analyzed statistic comprises adjusting the step size approximately proportionally to an amount of a predominance of a direction of movement of the filter coefficient.

9. The method of claim 8,
wherein said adjusting the parameter based on the analyzed statistic further comprises adjusting the step size by a predetermined minimum value when a current direction of coefficient movement does not conform to the predominance of the direction of movement of the filter coefficient.

10. The method of claim 8,
wherein said adjusting the step size approximately proportionally to an amount of a predominance of a direction of movement of the filter coefficient comprises adjusting the step size by a value based on a direction count of the movement of the filter coefficient.

11. The method of claim 1,
wherein the parameter that affects speed of convergence is a leakage parameter.

12. The method of claim 11,
wherein said adjusting the parameter based on the analyzed statistic comprises adjusting the leakage parameter approximately inversely proportionally to an amount of a predominance of a direction of movement of the filter coefficient.

13. The method of claim 1,
wherein the adaptive filter is used in an active noise cancellation system.

14. The method of claim 13,
wherein the adaptive filter is used in the active noise cancellation system to generate an anti-noise signal or to model an electro-acoustic path of an audio device.

15. An adaptive filter, comprising:
a digital signal processor programmed to:
analyze, in a frequency domain, a statistic of coefficient movement of the adaptive filter; and
adjust, in the frequency domain, a parameter that affects speed of convergence of the adaptive filter based on the analyzed statistic of filter coefficient movement; and
wherein the statistic of coefficient movement comprises a measure of an attribute of a sample of a change of adaptive filter coefficients between a current and next value of the coefficients.

16. The adaptive filter of claim 15,
wherein the digital signal processor maintains, for each frequency bin of a plurality of frequency bins, an associated:
coefficient;
statistic of coefficient movement; and
parameter that affects speed of convergence of the adaptive filter;
wherein to analyze the statistic of coefficient movement in the frequency domain, the digital signal processor analyzes, for each frequency bin of the plurality of frequency bins, the statistic of coefficient movement associated with the frequency bin; and
wherein to adjust the parameter in the frequency domain, the digital signal processor adjusts, for each frequency bin of the plurality of frequency bins, the parameter associated with the frequency bin based on the analyzed statistic associated with the frequency bin.

17. The adaptive filter of claim 16,
wherein to adjust the parameter, the digital signal processor decreases the step size when the frequency bin is above a predetermined upper frequency bin.

18. The adaptive filter of claim 16,
wherein the digital signal processor determines a current maximum distance of the filter coefficient movement among the frequency bins and maintains a smoothed version of the maximum distance;
wherein to analyze the statistic of coefficient movement in the frequency domain, the digital signal processor determines a condition that is whether the current maximum distance exceeds a product of the smoothed version and a scaling factor; and
wherein to adjust the parameter in the frequency domain, the digital signal processor sets the parameter to a value that causes the speed of convergence to be approximately zero when the condition is satisfied.

19. The adaptive filter of claim 15,
wherein coefficients comprise complex numbers having a real part and an imaginary part;
wherein the statistic of coefficient movement comprises separate statistics for the real part of the coefficients and the imaginary part of the coefficients; and
wherein the parameter comprises separate parameters for the real part of the coefficients and the imaginary part of the coefficients.

20. The adaptive filter of claim 15,
wherein the statistic comprises direction counts of the filter coefficient movement.

21. The adaptive filter of claim 15,
wherein the parameter that affects speed of convergence is a step size.

22. The adaptive filter of claim 21,
wherein to adjust the parameter based on the analyzed statistic, the digital signal processor adjusts the step size approximately proportionally to an amount of a predominance of a direction of movement of the filter coefficient.

23. The adaptive filter of claim 22,
wherein further to adjust the parameter based on the analyzed statistic, the digital signal processor adjusts the step size by a predetermined minimum value when a current direction of movement of the filter coefficient does not conform to the predominance of the direction of movement of the filter coefficient.

24. The adaptive filter of claim 22,
wherein to adjust the step size approximately proportionally to an amount of a predominance of a direction of movement of the filter coefficient, the digital signal processor adjusts the step size by a value based on a direction count of the movement of the filter coefficient.

25. The adaptive filter of claim 15,
wherein the parameter that affects speed of convergence is a leakage parameter.

26. The adaptive filter of claim 25,
wherein to adjust the parameter based on the analyzed statistic, the digital signal processor adjusts the leakage parameter approximately inversely proportionally to an amount of a predominance of a direction of movement of the filter coefficient.

27. The adaptive filter of claim 15,
wherein the adaptive filter is used in an active noise cancellation system.

28. The adaptive filter of claim 27,
wherein the adaptive filter is used in the active noise cancellation system to generate an anti-noise signal or to model an electro-acoustic path of an audio device.

* * * * *